(12) United States Patent
Schaible et al.

(10) Patent No.: US 8,704,108 B2
(45) Date of Patent: Apr. 22, 2014

(54) INDUCTORS OCCUPYING SPACE ABOVE CIRCUIT BOARD COMPONENTS

(75) Inventors: Todd Martin Schaible, Orono, MN (US); Neil Bryan Adams, Burnsville, MN (US); Matthew David Kretman, Maplewood, MN (US)

(73) Assignee: Astec International Limited, Kwon Tong, Kowloon (HK)

( * ) Notice: Subject to any disclaimer, the term of this patent is extended or adjusted under 35 U.S.C. 154(b) by 378 days.

(21) Appl. No.: 13/079,281

(22) Filed: Apr. 4, 2011

(65) Prior Publication Data

US 2011/0242775 A1    Oct. 6, 2011

Related U.S. Application Data

(60) Provisional application No. 61/320,538, filed on Apr. 2, 2010.

(51) Int. Cl.
*H01L 23/28* (2006.01)
(52) U.S. Cl.
USPC .......................................... 174/521; 361/782

(58) Field of Classification Search
USPC ........................ 336/90, 92; 174/521; 361/782
See application file for complete search history.

(56) References Cited

U.S. PATENT DOCUMENTS

| | | | |
|---|---|---|---|
| 6,198,373 B1* | 3/2001 | Ogawa et al. | 336/83 |
| 6,713,676 B2 | 3/2004 | Fischer | |
| 6,885,278 B2 | 4/2005 | Nakao et al. | |
| 7,288,728 B2* | 10/2007 | Koike | 174/521 |
| 2005/0047103 A1* | 3/2005 | Bothe et al. | 361/782 |
| 2006/0108663 A1 | 5/2006 | Sanzo et al. | |
| 2007/0072340 A1 | 3/2007 | Sanzo et al. | |
| 2007/0257759 A1* | 11/2007 | Lee et al. | 336/90 |
| 2013/0141886 A1* | 6/2013 | Chen et al. | 361/782 |

* cited by examiner

*Primary Examiner* — Hung Ngo
(74) *Attorney, Agent, or Firm* — Harness, Dickey & Pierce, P.L.C.

(57) ABSTRACT

Methods of making an assembly are disclosed. The assembly may include a circuit board with a top surface and a circuit component mounted on the top surface of the circuit board. The method may include positioning an inductor coil above the circuit component and the top surface of the circuit board and encapsulating the inductor coil, the circuit component and at least part of the top surface of the circuit board in a magnetic material. Assemblies according to such methods are also disclosed.

23 Claims, 5 Drawing Sheets

INDUCTORS OCCUPYING SPACE ABOVE CIRCUIT BOARD COMPONENTS

CROSS-REFERENCE TO RELATED APPLICATION

This application claims the benefit of U.S. Provisional Application No. 61/320,538 filed on Apr. 2, 2010. The entire disclosure of the above application is incorporated herein by reference.

FIELD

The present disclosure relates to assemblies including inductors occupying space above a circuit board and/or circuit components mounted on the circuit board.

BACKGROUND

This section provides background information related to the present disclosure which is not necessarily prior art.

Many electronic circuits include inductors. In some circuits, including, for example, some power supply modules, the circuit's inductor is one of the largest components and may limit flexibility and/or restrict options in the design of a printed circuit board (PCB) layout, packaging, cases, etc. FIG. 1 illustrates one such prior art power supply module 100 including a circuit board 102 and circuit components 104 mounted on the circuit board. The module 100 also includes a large (relative to the components 104) inductor 106 mounted on the circuit board.

SUMMARY

This section provides a general summary of the disclosure, and is not a comprehensive disclosure of its full scope or all of its features.

According to one aspect of this disclosure, a method of making a module including a circuit board having a top surface and a circuit component mounted on the top surface of the circuit board is disclosed. The method includes positioning an inductor coil above the circuit component on the top surface of the circuit board and encapsulating the inductor coil, the circuit component and at least part of the top surface of the circuit board in a magnetic material.

According to another aspect of the present disclosure, a module includes a circuit board having a top surface and a bottom surface and at least one circuit component mounted on the top surface of the circuit board. An inductor coil is positioned above the top surface of the circuit board and the circuit component and a magnetic material encapsulates the inductor coil, the circuit component, and at least part of the top surface of the circuit board.

According to yet another aspect of this disclosure a power converter module includes a circuit board having a top surface and a bottom surface. At least one switch is mounted on the top surface. An inductor coil is positioned above the top surface of the circuit board and the switch. A magnetic material encapsulates the inductor coil, the switch and at least part of the top surface of the circuit board.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1:
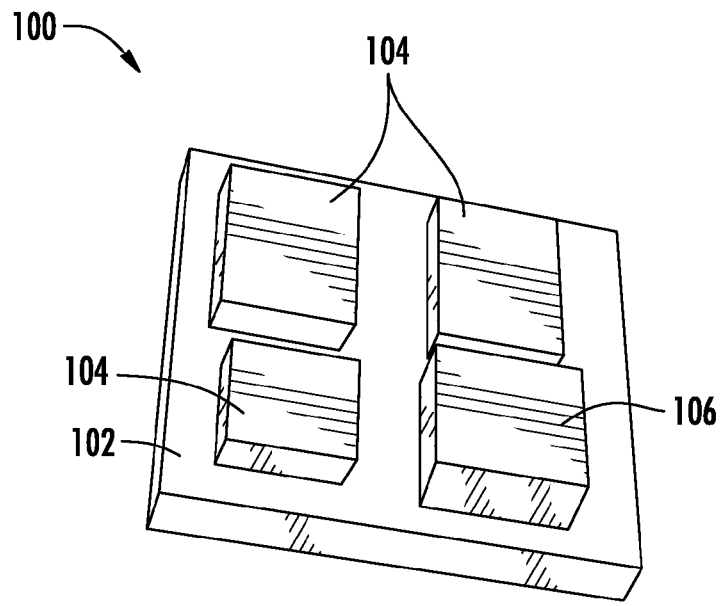
FIG. 1 is a prior art module including an inductor mounted on a circuit board.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent,"

etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

According to one aspect of the present disclosure, a method of making an assembly including a circuit board having a top surface and a circuit component mounted on the top surface of the circuit board is disclosed. The method includes positioning an inductor coil above the circuit component and the top surface of the circuit board. The method also includes encapsulating the inductor coil in an encapsulating material.

The encapsulating material may be any suitable material for encapsulating the inductor coil. The material may be a non-magnetic material or may be a magnetic material.

The magnetic material may be any suitable magnetic material. For example, the magnetic material may include powder iron, ferrite, etc. Alternatively, the magnetic material may include a non-magnetic material that is impregnated with a magnetic filler. The material may include, for example, a plastic impregnated with a magnetic filler, a solid bonding elastomer impregnated with a magnetic filler, etc.

The encapsulating material and the inductor coil may form an inductor for the module. If the encapsulating material is non-magnetic, the material and the inductor coil may form an air-core inductor. When the encapsulating material is a magnetic material, the magnetic material may form a core of the inductor. By building the inductor this way, the core's cross sectional area is enhanced and the inductance may be maximized. Further, the inductor may be positioned in space usually void of any useful circuitry (e.g., the space between circuit elements and whatever is above them, such as a case, housing, another circuit board, etc.). Furthermore, the magnetic material may act as an EMI shield to contain (i.e., limit, block, prevent, obstruct, etc.) stray magnetic fields emanating from the circuit component(s).

The encapsulating material may be a thermally conductive material. The encapsulating material may be thermally conductive inherently and/or due to thermally conductive material added to the encapsulating material. The thermally conductive material may serve to transfer heat from items in contact with or encapsulated within it. Accordingly, the encapsulating material can act as a heatsink and/or interface for additional heatsinking.

The inductor coil may be electrically coupled to the circuit board. Accordingly, the inductor coil may form part of a circuit on the circuit board. The inductor coil may be connected to the circuit board by any appropriate connection. For example, the inductor coil may be connected by surface mounting techniques, through-hole techniques, etc. The inductor may be mechanically attached to and physically supported by the electrical connection with the circuit board. Alternatively, or additionally, the assembly may include an additional support structure to mechanically support the inductor coil.

The assembly may also include a case. The circuit board, the circuit component(s) and the inductor coil may be positioned within an interior space of the case. In such an embodiment, the encapsulating material may fill substantially all of the interior space of the case not occupied by the circuit board, the component and the inductor coil.

The assembly may be a power converter assembly. For example, the assembly may be a non-isolated power converter module (e.g., single phase or multiphase) to be located near a load for which it is to supply power. The circuit component(s) may include a power switch in the power converter, for example a MOSFET. The inductor formed by the inductor coil and the encapsulating magnetic material may be a power inductor for the power converter. A multiphase embodiment may incorporate coupling between inductors. In at least one embodiment, the module is a power converter module having a buck converter topology. In another example, the power converter may also be an isolated power converter. In such an isolated power converter, core insulation is needed to maintain spacing between primary and secondary windings.

Any suitable manufacturing techniques may be used to form a module according to the present disclosure. For example, in one example embodiment, the assembly is constructed by attaching all components of an electrical circuit to the circuit board. The inductor coil is mechanically and electrically connected to the circuit board. The circuit board, with components and inductor coil attached are then placed in a mold. The magnetic material is then molded to the assembly in the mold. This may be done by placing the magnetic material in the mold before inserting the circuit board, by injecting the magnetic material into the mold after the circuit board is inserted, etc. The magnetic material may be cured with temperature and/or pressure (depending on the specific magnetic material chosen). When the magnetic material has cured, the assembly, including the circuit board, circuit component(s) and inductor coil encapsulated in the magnetic material, may be removed from the mold.

In another example embodiment, the magnetic material is molded to the assembly directly in a case. In such embodiment, the assembly's case acts as a mold (which is not removed) for the magnetic material. The assembly is constructed as discussed above. The assembly's case is used as the mold. The circuit board, components, inductor coil and encapsulating magnetic material are not, however, removed from the mold/case after the magnetic material is cured. Depending on the interior shape of the case, some or all of the interior of the case above the surface of the circuit board may be filled with magnetic material. Accordingly, it is possible to fill all free space in the case (e.g., all space in the case that is not occupied by the circuit board, the component(s) mounted on the circuit board and the inductor coil) with the magnetic material. This may maximize and/or optimize the size of the inductor core for the inductor formed of the inductor coil and the magnetic material.

Example assemblies incorporating one or more aspects disclosed herein will now be discussed with reference to FIGS. 2 to 8.

Figure 2:
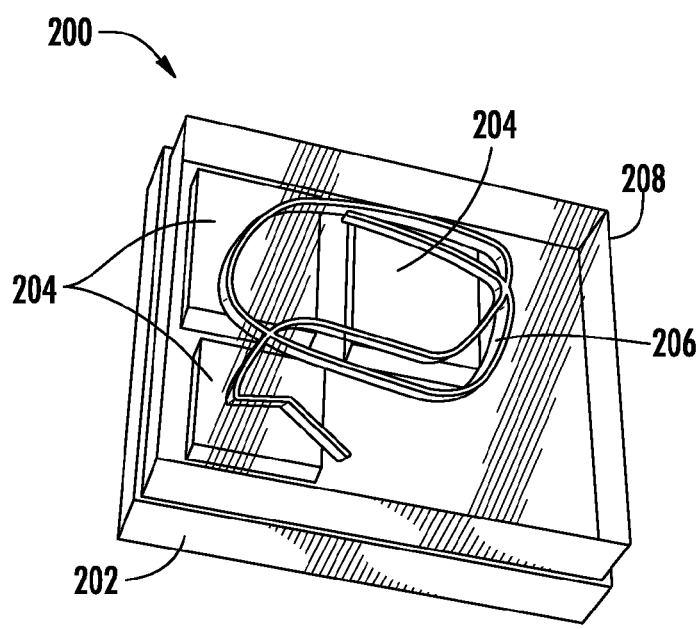
FIG. 2 is a top isometric view of an assembly according to at least one aspect of this disclosure.
Figure 3:
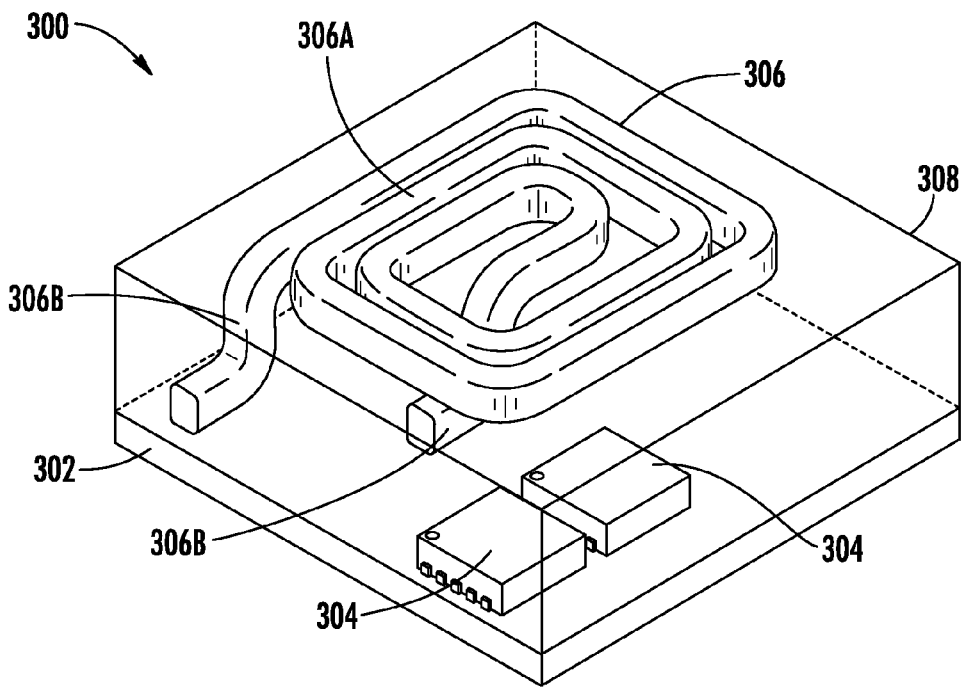
FIG. 3 is an isometric view of another assembly according to at least one aspect of this disclosure.
Figure 4:
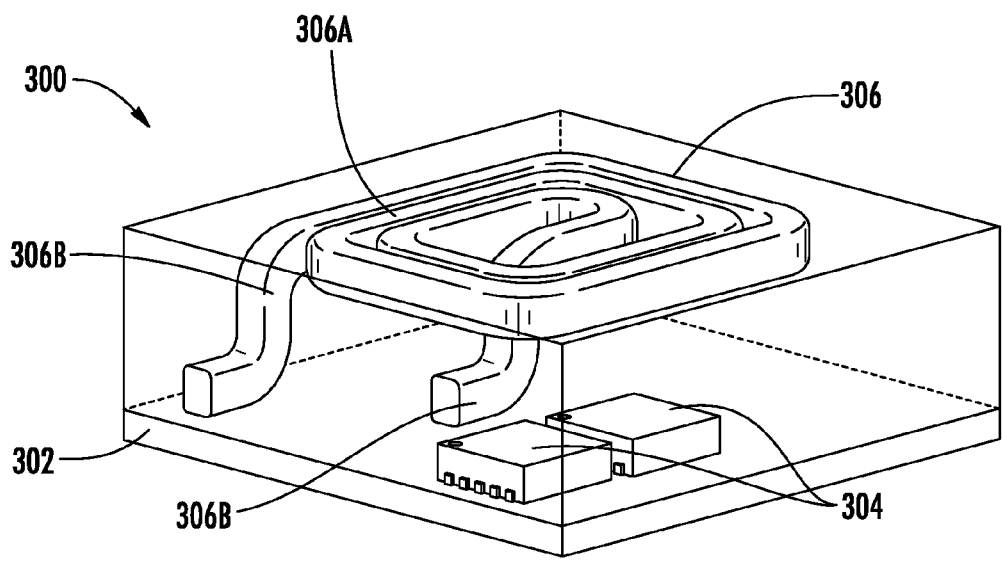
FIG. 4 is a different isometric view of the assembly of FIG. 3.
Figure 5:
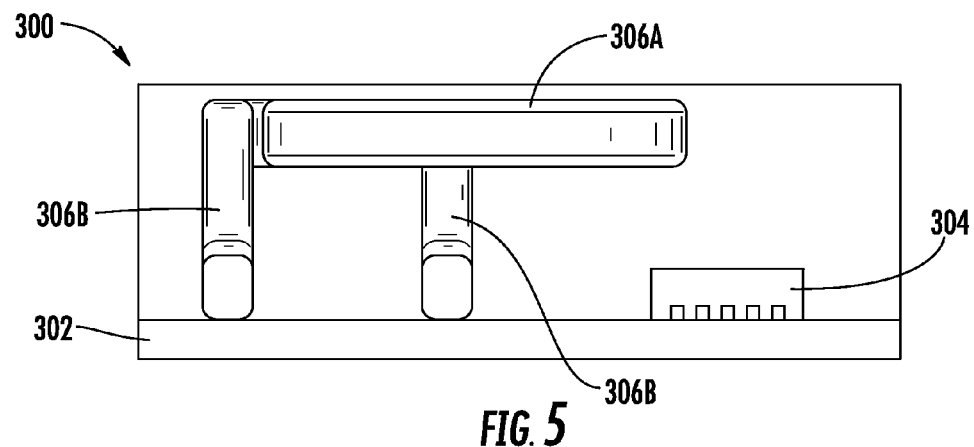
FIG. 5 is a side elevation view of the assembly of FIG. 3.
Figure 6:
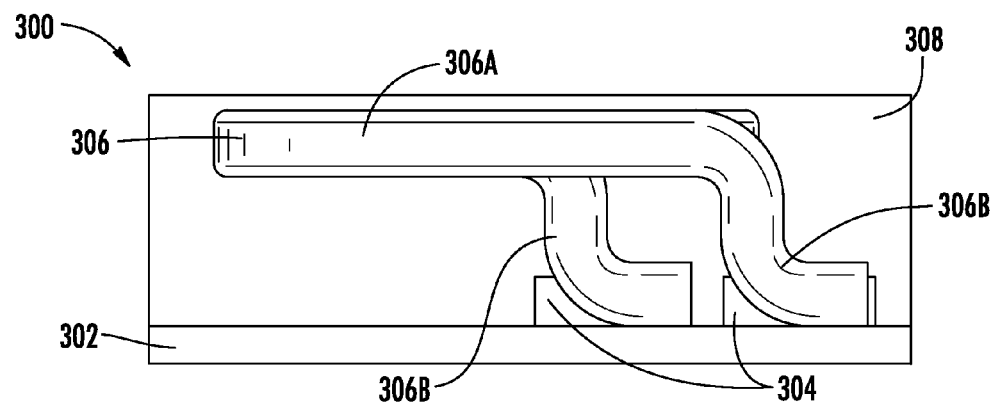
FIG. 6 is a side elevation view of the assembly of FIG. 3 rotated ninety degrees from the view in FIG. 5.

FIG. 2 illustrates one example assembly 200. The assembly 200 includes a circuit board 202 having a top surface and a bottom surface. Circuit components 204 (e.g., switches, integrated circuits, etc.) are mounted on the top surface of the circuit board 202. An inductor coil 206 is positioned above the top surface of the circuit board 202 and the circuit components 204. The inductor coil 206, the circuit components 204 and the top surface of the circuit board 202 are encapsulated by a magnetic material 208. The magnetic material 208 is illustrated semi-transparent in FIG. 2.

The magnetic material 208 may include powder iron and/or ferrite. Alternatively, the material 208 may include a non-magnetic material that is impregnated with a magnetic filler. For example, the magnetic material 208 may be a plastic impregnated with a magnetic filler, a solid bonding elastomer impregnated with a magnetic filler, etc. The magnetic material 208 and the inductor coil 206 form an inductor for the assembly 200.

The magnetic material 208 may be a thermally conductive material. The magnetic material 208 may be thermally conductive either because of the magnetic material's inherent characteristics, by addition of a thermally conductive material to the magnetic material 208, or both. The magnetic material 208 acts as a heatsink and interface for additional heatsinking.

FIGS. 3-6 illustrates another example assembly 300. The assembly 300 includes a circuit board 302 having a top surface and a bottom surface. Circuit components 304 (e.g., switches, integrated circuits, etc.) are mounted on the top surface of the circuit board 302. An inductor coil 306 is positioned above the top surface of the circuit board 302 and the circuit components 304. The inductor coil 306, the circuit components 304 and the top surface of the circuit board 302 are encapsulated by a magnetic material 308. The magnetic material 308 is illustrated semi-transparent in FIGS. 3-6.

The magnetic material 308 may include powder iron and/or ferrite. Alternatively, the magnetic material 308 may include a non-magnetic material that is impregnated with a magnetic filler. For example, the magnetic material 308 may be a plastic impregnated with a magnetic filler, a solid bonding elastomer impregnated with a magnetic filler, etc. The magnetic material 308 and the inductor coil 306 form an inductor for the assembly 300.

The magnetic material 308 may be a thermally conductive material. The magnetic material 308 may be thermally conductive either because of the magnetic material's inherent characteristics, by addition of a thermally conductive material to the magnetic material 308, or both. The magnetic material 308 acts as a heatsink and interface for additional heatsinking.

The inductor coil 306 may include a coil portion 306A and lead portions 306B. The lead portions 306B may depend toward the circuit board in a direction generally perpendicular to a plane formed by the coil portion 306A. The lead portions 306B are generally used for connection (e.g., electrical, mechanical, etc.) to the underlying circuit board 302. Although illustrated as a monolithically formed inductor coil 306, the inductor coil 306 may be formed by separate components, such as, for example, using a separate part for one or both lead portions 306B.

Figure 7:
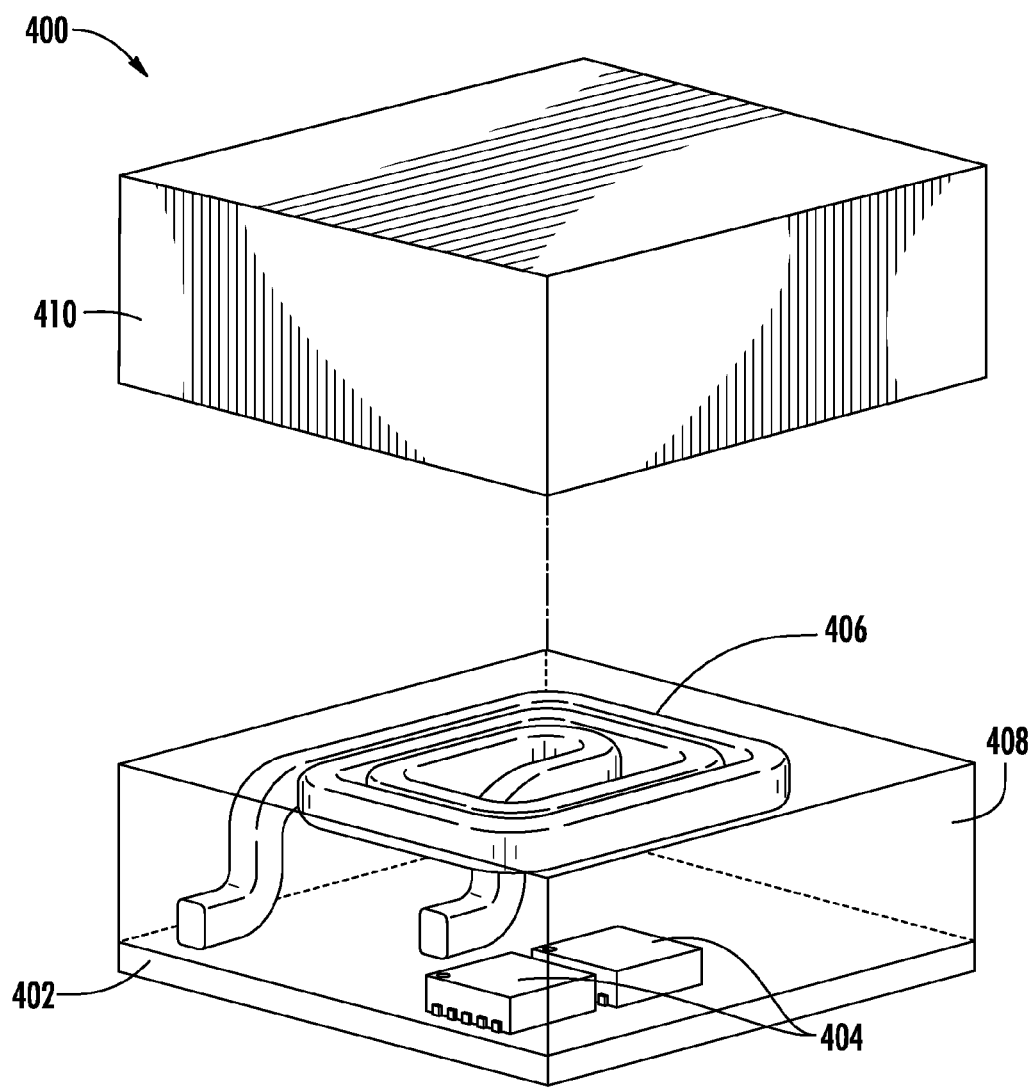
FIG. 7 is an exploded view of an assembly including a case according to at least one aspect of this disclosure.
Figure 8:
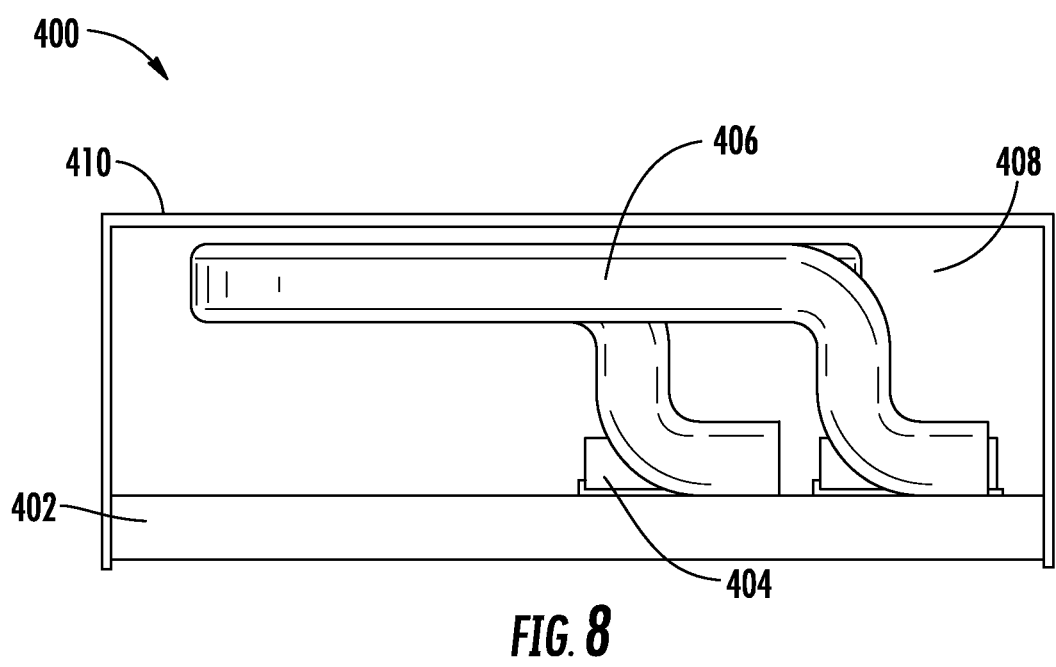
FIG. 8 is a partial cutaway side elevation view of the assembly of FIG. 7 with the case attached.

FIGS. 7 and 8 illustrate another example assembly 400. The assembly 400 includes a circuit board 402 having a top surface and a bottom surface. Circuit components 404 (e.g., switches, integrated circuits, etc.) are mounted on the top surface of the circuit board 402. An inductor coil 406 is positioned above the top surface of the circuit board 402 and the circuit components 404. The inductor coil 406, the circuit components 404 and the top surface of the circuit board 402 are encapsulated by a magnetic material 408 and a case 410. The magnetic material 408 is illustrated semi-transparent in FIGS. 7 and 8.

The magnetic material may include powder iron and/or ferrite. Alternatively, the magnetic material 408 may include a non-magnetic material that is impregnated with a magnetic filler. For example, the magnetic material 408 may be a plastic impregnated with a magnetic filler, a solid bonding elastomer impregnated with a magnetic filler, etc. The magnetic material 408 and the inductor coil 406 form an inductor for the assembly 400.

The magnetic material 408 may be a thermally conductive material. The magnetic material 408 may be thermally conductive either because of the magnetic material's inherent characteristics, by addition of a thermally conductive material to the magnetic material 408, or both. The magnetic material 408 acts as a heatsink and interface for additional heatsinking. For example, the case 410 may be a thermally conductive case permitting heat to be transferred from the inductor coil 406 and/or components 404 through the magnetic material 408 and the case 410 to the air surrounding the case 410.

The circuit board 402, components 404, inductor coil 406 and magnetic material 408 all fit within an interior portion (also sometimes referred to as an interior volume or space) of the case 410. The magnetic material 408 fills substantially all of the interior portion of the case 410 not occupied by the circuit board 402, components 404 and inductor coil 406.

The aspects discussed above may be used (either alone or in combination) for any suitable assemblies and assembly construction. For example, the assembly may be a land grid array (LGA) assembly, a system on a chip (SOC), a monolithic application, etc. The assembly may be a power supply assembly. The power supply assembly may be any suitable type of power supply. For example, the power supply may be a single phase power supply, a multiphase power supply, an isolated power supply, a non-isolated power supply, etc. The inductor in the assembly may be a power inductor, a coupling inductor, etc. Further, in some embodiments, multiple inductor coils may be included, which may be, for example, coupled inductors.

Although illustrated using generally square circuit boards, the aspects disclosed herein are not limited to square circuit boards and may be used with circuit boards of any shape (e.g., rectangular, octagonal, round, etc.).

The inductor coil need not be fully encapsulated by the encapsulating material. In at least one embodiment, at least part of the inductor coil is not encapsulated in the encapsulating material.

The aspects and techniques discussed above permit the shape of an inductor to be optimized to benefit efficiency and performance. By using available space between a case and circuitry within the case, a larger and more efficient inductor may be created. Such inductors may also help contain stray magnetic fields and allow more area for FET die.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed:

1. An assembly comprising:
   a circuit board having a top surface and a bottom surface;
   at least one circuit component mounted on the top surface of the circuit board;
   an inductor coil positioned above the top surface of the circuit board and the circuit component; and
   an encapsulating material including a magnetic material, the encapsulating material including the magnetic material encapsulating at least part of the inductor coil, the at least one circuit component and at least part of the to surface of the circuit board, wherein the encapsulating material including the magnetic material and the inductor coil form an inductor.

2. The assembly of claim 1 wherein the magnetic material comprises powder iron.

3. The assembly of claim 1 wherein the magnetic material comprises ferrite.

4. The assembly of claim 1 wherein the magnetic material comprises a plastic impregnated with a magnetic filler.

5. The assembly of claim 1 wherein the magnetic material comprises a solid bonding elastomer impregnated with a magnetic filler.

6. The assembly of claim 1 wherein the magnetic material is thermally conductive.

7. The assembly of claim 1 wherein the magnetic material encapsulates substantially all of the top surface of the circuit board.

8. The assembly of claim 1 wherein the magnetic material forms an inductor core.

9. The assembly of claim 1 further comprising a case having an interior volume, wherein the circuit board, the circuit component, and the inductor coil are housed within the interior volume of the case, the magnetic material filling substantially all of the interior volume not occupied by the circuit board, the circuit component, and the inductor coil.

10. The assembly of claim 1 wherein the inductor coil includes a lead portion adapted for connection to the circuit board, the lead portion depending from the inductor coil in a direction substantially perpendicular to a plane defined by the inductor coil.

11. The assembly of claim 1 wherein the assembly comprises a power converter assembly and wherein the at least one circuit component comprises a power switch.

12. A method of making an assembly, the assembly including a circuit board having a top surface and a circuit component mounted on the top surface of the circuit board, the method comprising:
   positioning an inductor coil above the circuit component and the top surface of the circuit board; and
   encapsulating at least part of the inductor coil, the circuit component, and at least part of the top surface of the circuit board in an encapsulating material including a magnetic material, wherein the encapsulating material including the magnetic material and the inductor coil form an inductor.

13. The method of claim 12 wherein the magnetic material includes a non-magnetic material impregnated with a magnetic filler.

14. The method of claim 13 wherein the non-magnetic material is thermally conductive.

15. The method of claim 12 wherein the magnetic material is thermally conductive.

16. The method of claim 12 wherein the circuit board, the circuit component and the inductor coil are positioned within an interior space of a case, and wherein the encapsulating material including the magnetic material fills substantially all of the interior space of the case.

17. A power converter assembly comprising:
   a circuit board having a top surface and a bottom surface;
   at least one switch mounted on the top surface of the circuit board;
   an inductor coil connected to the circuit board and positioned above the top surface of the circuit board and the switch;
   an encapsulating material including a magnetic material, the encapsulating material including the magnetic material encapsulating the inductor coil, the switch and at least part of the top surface of the circuit board, wherein the encapsulating material including the magnetic material and the inductor coil form an inductor.

18. The power converter assembly of claim 17 further comprising a case having an interior portion, wherein the circuit board, the switch, and the inductor coil are housed within the interior portion of the case, the magnetic material filling substantially all of the interior portion not occupied by the circuit board, the switch, and the inductor coil.

19. The power converter assembly of claim 17 wherein the power converter assembly comprises a buck converter.

20. The power converter assembly of claim 17 wherein the magnetic material is thermally conductive.

21. The power converter assembly of claim 17 wherein the magnetic material comprises a non-magnetic material impregnated with a magnetic filler.

22. An assembly comprising:
   a circuit board;
   an inductor mounted to the circuit board;
   a component mounted to the circuit board; and
   an encapsulating material including a magnetic material, the encapsulating material including the magnetic material encapsulating at least a part of the inductor, the component and at least part of the circuit board, wherein at least a portion of the inductor is positioned above the component.

23. The assembly of claim 22 wherein the inductor comprises an inductor coil.

* * * * *

UNITED STATES PATENT AND TRADEMARK OFFICE
CERTIFICATE OF CORRECTION

PATENT NO. : 8,704,108 B2
APPLICATION NO. : 13/079281
DATED : April 22, 2014
INVENTOR(S) : Schaible et al.

Page 1 of 1

It is certified that error appears in the above-identified patent and that said Letters Patent is hereby corrected as shown below:

In the Claims

Column 7, in claim 1, line 18, replace "to" with "top."

Signed and Sealed this
Twenty-ninth Day of July, 2014

Michelle K. Lee
*Deputy Director of the United States Patent and Trademark Office*